United States Patent [19]

Schröder

[11] 4,119,922
[45] Oct. 10, 1978

[54] CIRCUIT FOR AUTOMATIC VOLUME COMPRESSION OR VOLUME EXPANSION

[75] Inventor: Ernst Schröder, Hanover, Germany

[73] Assignee: Licentia Patent-Verwaltungs-G.m.b.H, Germany

[21] Appl. No.: 791,134

[22] Filed: Apr. 26, 1977

[30] Foreign Application Priority Data

Apr. 30, 1976 [DE] Fed. Rep. of Germany ....... 2619192

[51] Int. Cl.$^2$ .............................................. H03G 3/20
[52] U.S. Cl. ...................................... 330/86; 330/110
[58] Field of Search ................. 330/86, 110, 254, 282; 333/14

[56] References Cited

U.S. PATENT DOCUMENTS

| | | | |
|---|---|---|---|
| 3,223,936 | 12/1965 | Cook | 330/110 |
| 3,555,435 | 1/1971 | Vosteen | 330/86 X |
| 3,969,680 | 7/1976 | Wermuth | 333/14 X |
| 4,007,340 | 2/1977 | Russell | 330/86 X |

OTHER PUBLICATIONS

Ottesen, "Digitally Controlled Amplifier Circuits", *IBM Technical Disclosure Bulletin*, vol. 16, No. 11, Apr. 1974, pp. 3504, 3505.

*Primary Examiner*—James B. Mullins
*Attorney, Agent, or Firm*—McGlew and Tuttle

[57] ABSTRACT

The circuit includes a signal path extending between an information signal input terminal and an information signal output terminal. A differential amplifier, having a non-inverting input and an inverting input, is included in the signal path, and a feedback path, containing electronically controlled impedance, connects the amplifier inverting input to the amplifier output. A branch path is branched off from the information signal output terminal and, in this branch path, a control voltage is derived from the information signal and fed to the electronically controllable impedance. In accordance with the invention, the information signal input terminal is connected to the non-inverting amplifier input to feed the information signal thereto. Two diodes are connected in parallel with each other, but in oppositely poled relation, across the feedback circuit, to limit the feedback voltage between the amplifier output and the amplifier inverting input. The circuit may be used in a so-called compander system, in which the control voltage is fed to a differential amplifier in the branch path having an inverting input connected, over a feedback path containing a second electronically controllable impedance to its output, and with the control voltage being fed to the second electronically controllable impedance. In this second differential amplifier, arranged in the branch path, the information signals are also supplied to the non-converting input thereof, and the feedback voltage between the output and the inverting input is limited to a given value.

8 Claims, 2 Drawing Figures

CIRCUIT FOR AUTOMATIC VOLUME COMPRESSION OR VOLUME EXPANSION

FIELD AND BACKGROUND OF THE INVENTION

So-called "compander" systems comprise a compression circuit for volume compression of an information signal before the information signal is transmitted or stored, and further comprise an expansion circuit, for volume expansion, after the transmission or before the reproduction of a previously-stored information signal.

Such systems work, among others, with final control elements to reduce the signal amplitude or to influence the frequency of the signal, where the control signal, required for controlling the primary control element, is derived from the information input signal or the information output signal of the compander circuit.

A known system of this type is disclosed in German Pat. No. 24 06 258. In this known system, an amplifier, constructed as a differential amplifier, is provided in an information signal path for the information signal, and has an inverting input supplied with the information signal and connected, over a feedback path, containing an electronically controllable impedance, with the output of the amplifier. A branch path extends from either the information signal output or the information signal input of the information signal path, and, in this branch path, a control voltage is obtained from the information signal and supplied to the electronically controlled impedance.

Since the circuit components provided for generating the control voltage have, as a rule, unavoidable time constants, with resultant effective delays of the control signal, there is a possibility that, with the rapid rise of the input information signal, the above-mentioned amplifier cannot follow this rise so that a so-called overshoot will appear. Thus, a super-elevated output signal appears briefly at the output of the compander system, on compression. A corresponding likewise undesired effect appears, on expansion, when the amplitude of the input information signal changes very rapidly.

SUMMARY OF THE INVENTION

The invention is directed to the problem of avoiding the above-described disadvantage, so that the compander system also works satisfactorily with a relatively rapid change of the amplitude of the information signal. In accordance with the invention, this problem is solved by supplying the input information signal to the non-inverting amplifier input, and by limiting the feedback voltage between the amplifier output and the inverting input to a given value.

An object of the invention is to provide an improved circuit for automatic volume compression or volume expansion.

Another object of the invention is to provide such a circuit in a compander system.

A further object of the invention is to provide such a circuit which is free of the disadvantages of known circuits serving the same purpose.

For an understanding of the principles of the invention, reference is made to the following description of a typical embodiment thereof as illustrated in the accompanying drawing.

DESCRIPTION OF THE PREFERRED EMBODIMENTS

Figure 1:
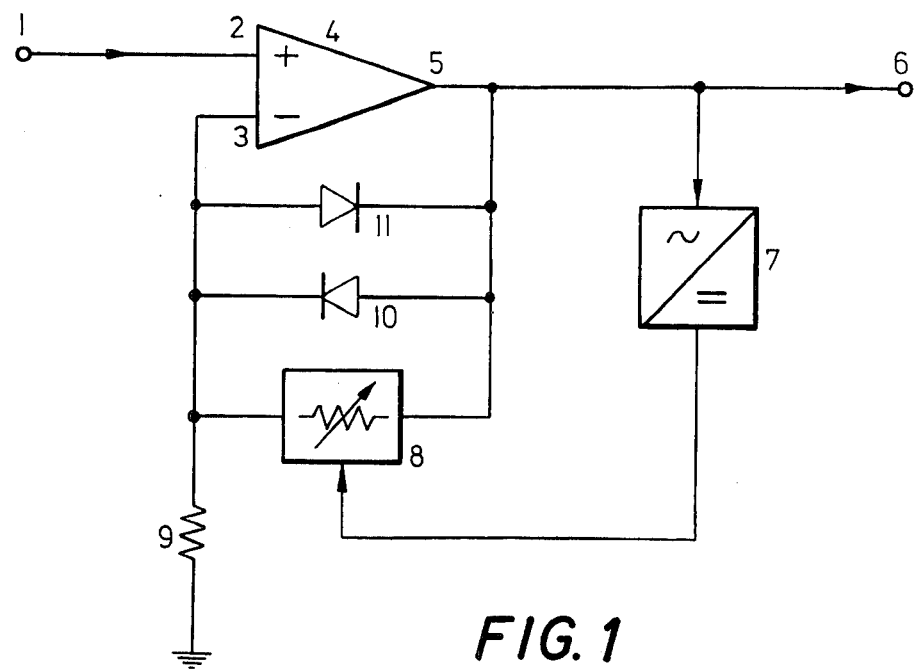
FIG. 1 is a block diagram of a circuit embodying the invention.

The single figure of the drawing is a simplified circuit diagram for a compression circuit of a compander arrangement. In this circuit, the a.c. information signal, supplied to the information signal input terminal 1 and to be compressed, is fed to the non-inverting input 2 of a differential amplifier 4. The inverting input 3 of differential amplifier 4 is connected, on the one hand, through an electronically controllable impedance 8, to the output 5 of differential amplifier 4, and, on the other hand, through an impedance 9 to the chassis or ground. Impedances 8 and 9 thus form a controllable feedback circuit. Due to this control of the feedback of differential amplifier 4, its amplification is controllable.

Output 5 of differential amplifier 4 is connected, on the one hand, to the information signal output terminal 6, and, on the other hand, to the input of a control voltage generator 7. Control voltage generator 7 consists principally of a rectifier circuit which generates, at its output, a d.c. control voltage in dependence on its input a.c. voltage. This control d.c. voltage is supplied to the control input of the controllable impedance 8, so that a control circuit is formed.

The above-described circuit arrangement is so dimensioned, for example, that information signals with a low level are relatively more amplified, in differential amplifier 4, than are information signals with a higher level. In this way, the output signal tapped in output terminal 6 has a lower volume range than the signal fed to input terminal 1.

However, it can happen in the above-described circuit than an overshoot appears at the output terminal 6, because of the unavoidable time constants with a relative rapid variation of the information signals, to be compressed, supplied to the input terminal 1. In order to suppress this effect, two diodes 10 and 11 are provided, and are connected in parallel between inverting input 3 and output 5 of amplifier 4, the diodes 10 and 11 being oppositely poled. Diodes 10 and 11 limit the feedback voltage appearing between output 5 and input 3 of differential amplifier 4 to a certain value. This limitation of the voltage, which is also that above the controllable impedance 8, has the effect that the output voltage of differential amplifier 4 can exceed the input voltage, at the non-inverting input 2, at the most by a given value, namely the limiting voltage of diodes 10 and 11. The above-mentioned overshoot is thus reduced to a substantially lower value.

This effect is based on the consideration that the output voltage of differential amplifier 4 is constituted by the voltage above impedance 9 and the voltage above controllable impedance 8. The voltage above impedance 9 is, in conventional differential amplifiers, substantially equal to the input voltage at amplifier input 2.

With low levels of the information signal to be compressed, the voltage above impedance 8 is relatively high compared to the input voltage, while it is relatively low at high levels of the information signal, as compared to the input voltage. In the latter, the amplification of differential amplifier tends toward one. The limiter diodes 10 and 11 thus have the effect that a rapid increase of the signal appearing, for example, at low levels, causes the feedback voltage to rise, not at random, but only up to the values set by the limiter diodes 10 and 11. The output voltage of differential amplifier 4 is thus likewise limited.

It is advantageous to select a limiting voltage of diodes 10 and 11 so that it corresponds to the maximum feedback voltage appearing in the rated operation of the above-described circuit.

Instead of diodes 10 and 11, there can also be used other means which are suitable to limit an a.c. voltage, or to keep it constant, starting from a certain threshold value.

When a compander incorporating the above-described compression circuit is so designed that the controllable impedance 8 is used in the expansion phases, there is obtained the above-described advantageous reduction of the overshoot with rapid variations of the input signal also in the expansion phase.

It is also possible to insert, between the junction of output 5 of differential amplifier 4 and output terminal 6, on the one hand, and of the input terminal of control voltage generator 7, on the other hand, another controllable amplifier which is also controlled by the output of the control voltage generator 7. In such an improved compander circuit, it is then advantageous to construct the other controllable amplifier like differential amplifier 4, and correspondingly to limit the feedback voltage.

Figure 2:
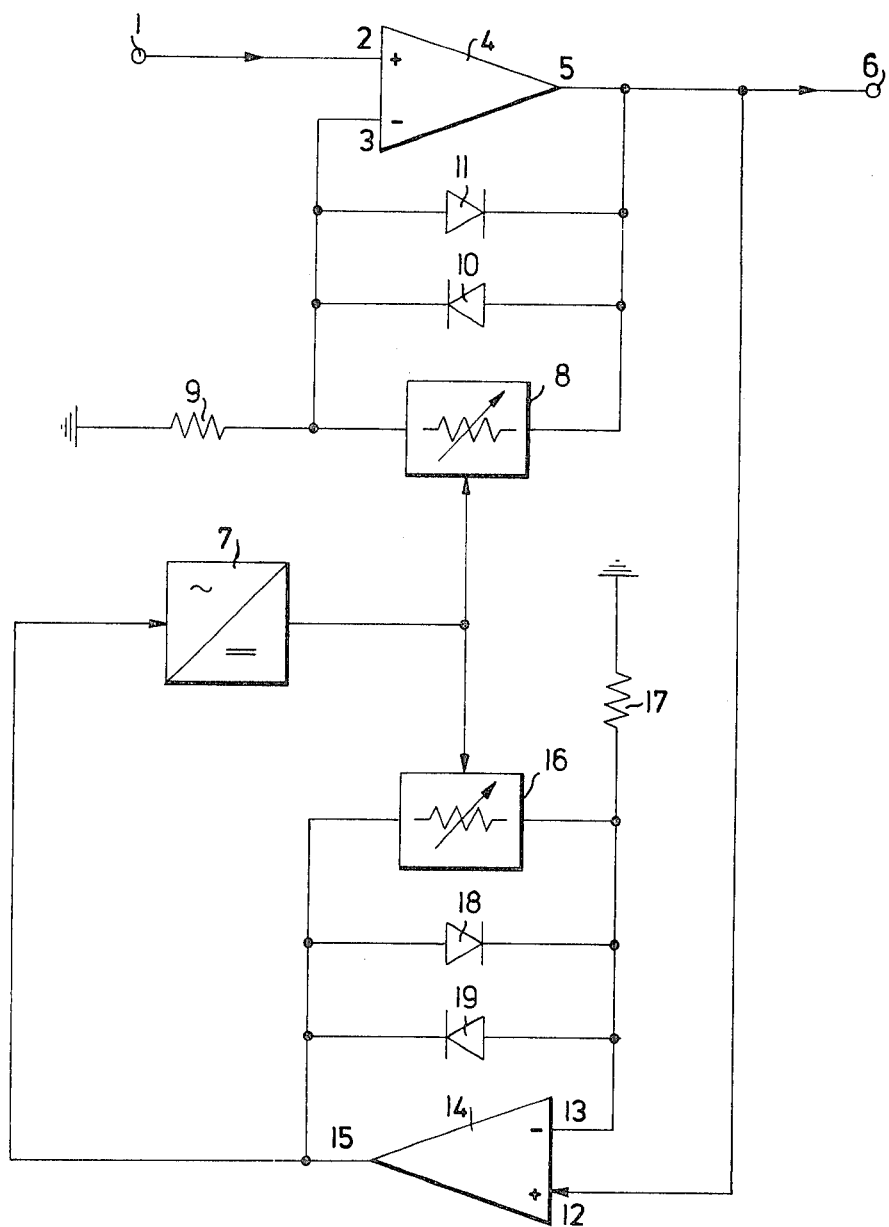
FIG. 2 is a block diagram illustrating a modification of the circuit shown in FIG. 1.

Such a circuit is shown in FIG. 2, in which output 5 of differential amplifier 4 is connected to the non-inverting input 12 of a second differential amplifier 14. Second differential amplifier 14 has an inverting input 13 connected, through a second electronically controllable impedance 16 and two antiparallel connected diodes 18 and 19, to the output 15 of second differential amplifier 14. Through a second impedance 17, the inverting input terminal of second differential amplifier 14 is connected to ground. In addition, output 15 of second differential amplifier 14 is connected to the input of controlled voltage generator 7. The control voltage output of generator 7 is supplied to the control inputs of the two electronically controllable impedances 8 and 16.

While specific embodiments of the invention have been shown and described in detail to illustrate the application of the principles of the invention, it will be understood that the invention may be embodied otherwise without departing from such principles.

What is claimed is:

1. In a circuit for automatic volume compression or expansion in a signal path, including a differential amplifier, having a non-inverting input, an inverting input and an output, in the signal path between an information signal input terminal and an information signal output terminal, with a feedback path, containing electronically controlled impedance, connecting the amplifier inverting input to the amplifier output, and with a branch path, branched off from one of the information signal input and output terminals, in which a control voltage is derived from the information signal and fed to the electronically controllable impedance: the improvement comprising, in combination, means feeding the information signal to said non-inverting amplifier input; and means connected between said amplifier output and said inverting input and limiting the feedback voltage therebetween to a given value.

2. In a circuit for automatic volume compression or expansion in a signal path, the improvement claimed in claim 1, in which said last-named means limits the feedback voltage only when a threshold value is exceeded, the threshold value being selected so that the feedback voltage appearing in the steady state condition is not substantially limited.

3. In a circuit for automatic volume compression or expansion in a signal path, the improvement claimed in claim 1, in which said last-named means comprises two parallel and oppositely poled diode paths connected between said amplifier output and said amplifier inverting input.

4. In a circuit for automatic volume compression or expansion in a signal path, the improvement claimed in claim 3, in which said diode paths are formed by semi-conductor diodes.

5. In a circuit for automatic volume compression or expansion in a single path, the improvement claimed in claim 1, in which said circuit forms part of the compander system; means arranged in said branch path and operable to vary the transmission amplitude; a second differential amplifier supplying the control voltage to said amplitude varying means, and having an inverting input connected to its output through a feedback path containing a second electronically controllable impedance; means feeding the control voltage to said second electronically controllable impedance; means feeding the information signals to a non-inverting input of said second differential amplifier; and means connected between the output of said second amplifier and the inverting input of said second amplifier and limiting the feedback voltage therebetween to a given value.

6. In a circuit for automatic volume compression or expansion in a signal path, the improvement claimed in claim 5, in which said last-named means limits the feedback voltage only when a threshold value is exceeded, the threshold value being selected so that the feedback voltage appearing in the steady state condition is not substantially limited.

7. In a circuit for automatic volume compression or expansion in a signal path, the improvement claimed in claim 5, in which said means limiting the feedback voltage comprises, for each differential amplifier, two parallel oppositely poled diode paths connected between the amplifier output and the amplifier inverting input.

8. In a circuit for automatic volume compression or expansion of the signal path, the improvement claimed in claim 7, in which said diode paths are constituted by semi-conductor diodes.

* * * * *